(12) United States Patent
Toshimitsu et al.

(10) Patent No.: US 10,785,868 B2
(45) Date of Patent: Sep. 22, 2020

(54) MULTILAYER PRINTED WIRING BOARD AND METHOD FOR PRODUCING MULTILAYER PRINTED WIRING BOARD

(71) Applicant: Panasonic Intellectual Property Management Co., Ltd., Osaka (JP)

(72) Inventors: Kenichi Toshimitsu, Fukushima (JP); Daisuke Nii, Fukushima (JP); Koichi Isaji, Fukushima (JP); Hiroyuki Fujisawa, Fukushima (JP); Yoshihiko Nakamura, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/336,698

(22) PCT Filed: Jul. 27, 2017

(86) PCT No.: PCT/JP2017/027204
§ 371 (c)(1),
(2) Date: Mar. 26, 2019

(87) PCT Pub. No.: WO2018/066213
PCT Pub. Date: Apr. 12, 2018

(65) Prior Publication Data
US 2020/0092994 A1  Mar. 19, 2020

(30) Foreign Application Priority Data
Oct. 5, 2016 (JP) .................................. 2016-197417

(51) Int. Cl.
*H05K 1/03* (2006.01)
*D03D 1/00* (2006.01)
(Continued)

(52) U.S. Cl.
CPC ......... *H05K 1/0366* (2013.01); *D03D 1/0082* (2013.01); *D03D 15/0011* (2013.01);
(Continued)

(58) Field of Classification Search
CPC .. H05K 1/0366; H05K 1/0271; H05K 3/4652; H05K 2201/0195;
(Continued)

(56) References Cited

U.S. PATENT DOCUMENTS 6,277,771 B1 * 8/2001 Nishimura .............. B29C 70/22
442/229
2006/0244128 A1  11/2006 Hayashi et al.
(Continued)

FOREIGN PATENT DOCUMENTS

JP  49-025499  3/1974
JP  51-010362  1/1976
(Continued)

OTHER PUBLICATIONS

International Search Report of PCT application No. PCT/JP2017/027204 dated Oct. 24, 2017.

*Primary Examiner* — Steven T Sawyer
(74) *Attorney, Agent, or Firm* — McDermott Will & Emery LLP

(57) ABSTRACT

A multilayer printed wiring board includes a core substrate, a first buildup layer, and a second buildup layer. The first buildup layer includes a first insulating layer and a first conductor layer alternately laminated with each other. The second buildup layer includes a second insulating layer and a second conductor layer alternately laminated with each other. The core substrate, the first insulating layer, and the second insulating layer each include a glass cloth. The glass cloth is woven with warp threads and weft threads. The warp threads each have a width narrower a width of each of the (Continued)

weft threads. Each of the warp threads constituting the glass cloth in the first insulating layer and the second insulating layer both lying adjacent to the core substrate is arranged perpendicular to each of the warp threads constituting the glass cloth in the core substrate.

4 Claims, 10 Drawing Sheets

(51) Int. Cl.
  *D03D 15/00* (2006.01)
  *H05K 1/02* (2006.01)
  *H05K 3/46* (2006.01)

(52) U.S. Cl.
  CPC ......... *H05K 1/0271* (2013.01); *H05K 3/4652* (2013.01); *H05K 2201/0195* (2013.01); *H05K 2201/029* (2013.01); *H05K 2201/093* (2013.01); *H05K 2201/09136* (2013.01)

(58) Field of Classification Search
  CPC ... H05K 2201/029; H05K 2201/09136; H05K 2201/093; H05K 1/03; H05K 3/46; D03D 1/0082; D03D 15/0011
  See application file for complete search history.

(56) References Cited

U.S. PATENT DOCUMENTS

| | | | | |
|---|---|---|---|---|
| 2010/0187679 | A1* | 7/2010 | Hayashi | H01L 21/4853 257/692 |
| 2011/0308840 | A1* | 12/2011 | Ooi | H05K 1/0248 174/251 |
| 2013/0206276 | A1* | 8/2013 | Takahashi | D03D 3/00 139/383 AA |
| 2014/0158406 | A1* | 6/2014 | Kato | H05K 1/024 174/250 |
| 2016/0007452 | A1* | 1/2016 | Yan | C08J 5/24 442/64 |
| 2019/0084188 | A1* | 3/2019 | Fujisawa | B32B 5/26 |

FOREIGN PATENT DOCUMENTS

| | | |
|---|---|---|
| JP | 2002-192521 | 7/2002 |
| JP | 2005-236216 | 9/2005 |
| JP | 2006-066894 | 3/2006 |
| JP | 2006-324642 | 11/2006 |
| WO | 2010/140214 | 12/2010 |

* cited by examiner

MULTILAYER PRINTED WIRING BOARD AND METHOD FOR PRODUCING MULTILAYER PRINTED WIRING BOARD

CROSS-REFERENCE TO RELATED APPLICATIONS

This application is a U.S. national stage application of the PCT International Application No. PCT/JP2017/027204 filed on Jul. 27, 2017, which claims the benefit of foreign priority of Japanese patent application 2016-197417 filed on Oct. 5, 2016, the contents all of which are incorporated herein by reference.

TECHNICAL FIELD

The present disclosure relates to a multilayer printed wiring board, and a method for producing the multilayer printed wiring board.

BACKGROUND

Unexamined Japanese Patent Publication No. 49-025499 describes a printed circuit board provided with metal foil to either or both of surfaces of an insulation base material made of a thermoplastic synthetic resin and glass fiber. In the printed circuit board, the glass fiber having a predetermined fiber length is used at a predetermined amount in order to secure flexibility and dimensional stability.

Further, Unexamined Japanese Patent Publication No. 2006-066894 describes a printed circuit plate formed from a substrate including an insulation resin layer containing a fiber base material. In the printed circuit plate, the fiber base material is used to suppress a change in dimension due to absorption moisture and temperature, as well as to secure dimensional stability.

SUMMARY

A multilayer printed wiring board according to a first aspect of the present disclosure includes a core substrate, a first buildup layer, and a second buildup layer. The core substrate has a first surface and a second surface. The first buildup layer is disposed on the first surface. The second buildup layer is disposed on the second surface. The core substrate includes a conductor layer disposed at each of the first surface and the second surface, and first glass cloth disposed between the first surface and the second surface. The first glass cloth is woven with first warp threads and first weft threads. The first warp threads each have a width narrower than a width of each of the first weft threads. The first buildup layer includes at least one first insulating layer and at least one first conductor layer which are alternately laminated with each other. The at least one first insulating layer includes a second glass cloth. The second glass cloth is woven with second warp threads and second weft threads. The second warp threads each have a width narrower than a width of each of the second weft threads. The second buildup layer includes at least one second insulating layer and at least one second conductor layer which are alternately laminated with each other. The at least one second insulating layer includes a third glass cloth. The third glass cloth is woven with third warp threads and third weft threads. The third warp threads each have a width narrower than a width of each of the third weft threads. Each of the second warp threads constituting the second glass cloth lying adjacent to the first surface of the core substrate is arranged perpendicular to each of the first warp thread constituting the first glass cloth. Each of the third warp threads constituting the third glass cloth lying adjacent to the second surface of the core substrate is arranged perpendicular to each of the first warp threads constituting the first glass cloth.

A method for producing a multilayer printed wiring board, according to a second aspect of the present disclosure, includes steps A to C described below.

Step A: a core substrate, first prepreg, second prepreg, first metal foil, and second metal foil are prepared. The core substrate has a first surface and a second surface. A conductor layer is disposed at each of the first surface and the second surface. The core substrate includes a first glass cloth woven with first warp threads and first weft threads. The first warp threads each have a width narrower than a width of each of the first weft threads. The first prepreg includes a second glass cloth woven with second warp threads and second weft threads. The second warp threads each have a width narrower than a width of each of the second weft threads. The second prepreg includes a third glass cloth woven with third warp threads and third weft threads. The third warp threads each have a width narrower than a width of each of the third weft threads.

Step B: the first prepreg is stacked on the first surface of the core substrate to allow each of the first warp threads constituting the first glass cloth to be arranged perpendicular to each of the second warp threads constituting the second glass cloth. The first metal foil is further stacked on the first prepreg. The second prepreg is stacked on the second surface to allow each of the first warp threads constituting the first glass cloth to be arranged perpendicular to each of the third warp threads constituting the third glass cloth. The second metal foil is further stacked on the second prepreg. In the state described above, the core substrate, the first prepreg, the second prepreg, the first metal foil, and the second metal foil are heated and pressed.

Step C: The first metal foil is processed to form a first conductor layer. The second metal foil is processed to form a second conductor layer. The first metal foil and the second metal foil lie at outermost surfaces of multilayer printed wiring board, respectively.

According to the present disclosure, conductor patterns on conductor layers in a core substrate can be inhibited from deviating in position from original positions.

DESCRIPTION OF EMBODIMENTS

Prior to description of exemplary embodiments of the present disclosure, problems found in conventional techniques will briefly be described. As highly-integrated semiconductor elements and small-sized components are developed in recent years, wiring density in printed wiring boards has been rapidly increased. Under this tendency, multilayer printed wiring boards each including three or more conductor layers have been widely used. One method for producing such multilayer printed wiring boards as described above is a buildup method, for example. Through the buildup method, insulating layers and conductor layers are alternately stacked to achieve a multilayered structure. In the method, by using via holes, conductor layers that are differently disposed in stacking direction are electrically connected with each other. In this case, it is important to align with each other in position lands on the conductor layers to be interlayer-coupled.

In the buildup method, insulating layers are normally heated and formed one by one. Hence, when a new insulating layer is heated and formed, an insulating layer already interlayer-coupled is further heated. At this time, thermal expansion, for example, on the insulating layer further heated could cause lands to be deviated in position, resulting in disconnection in via holes. To achieve a multilayered structure, insulating layers respectively having thermal histories different from each other increase in number. Thus, in order to achieve a multilayer printed wiring board having a large number of layers, higher position accuracy is required to improve reliability in interlayer-coupling. In particular, a conductor pattern of a conductor layer on a core substrate, which is provided to serve as a core in a multilayer printed wiring board, would be likely to deviate in position from an original position.

The present disclosure provides a multilayer printed wiring board, and a method for producing the multilayer printed wiring board, where a conductor pattern of a conductor layer on a core substrate can be inhibited from deviating in position from an original position.

First Exemplary Embodiment

In the first exemplary embodiment, multilayer printed wiring board 1 of a four-layered board will be described.

Figure 1:
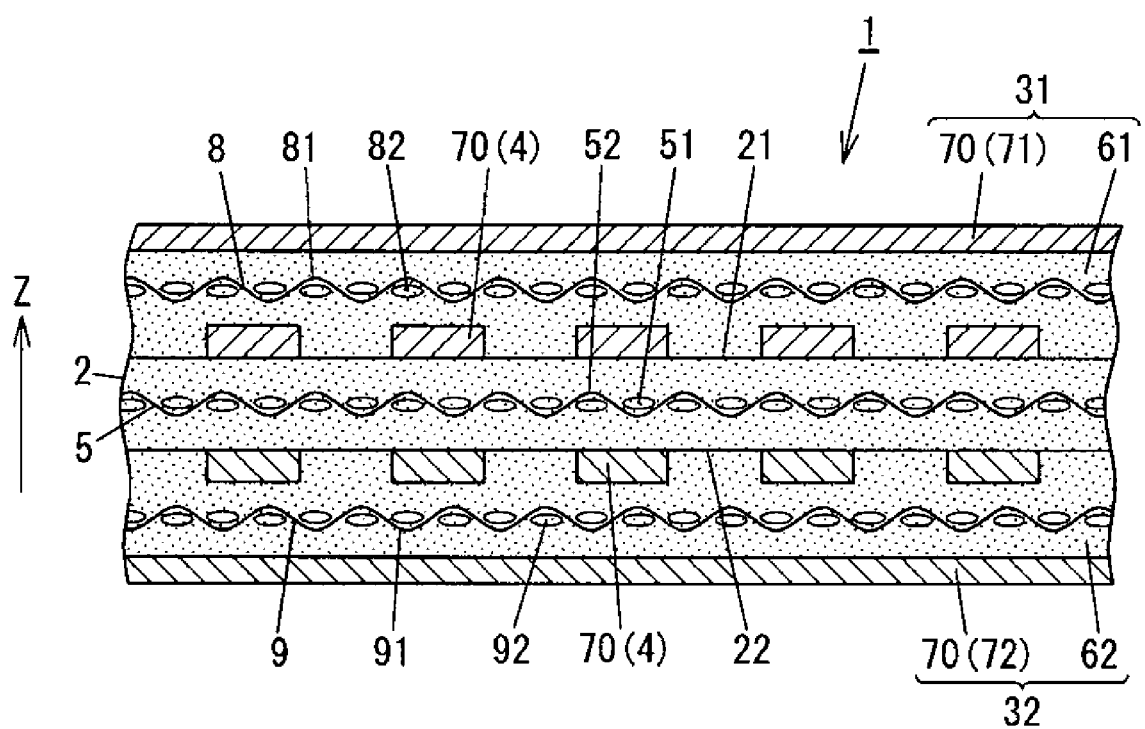
FIG. 1 is a schematic cross-sectional view illustrating a multilayer printed wiring board according to a first exemplary embodiment.

FIG. 1 illustrates multilayer printed wiring board 1 according to the first exemplary embodiment. In FIG. 1, Z axis represents a thickness direction of multilayer printed wiring board 1. Multilayer printed wiring board 1 includes core substrate 2, first buildup layer 31, and second buildup layer 32.

First, core substrate 2 will be described. Core substrate 2 can be a support body configured to support first buildup layer 31 and second buildup layer 32. Core substrate 2 has electric insulation. A specific example of core substrate 2 is an insulated substrate. To acquire the insulated substrate, glass cloth 5 is impregnated with a thermosetting resin. The thermosetting resin is then heated so as to be fully cured. Specific examples of the thermosetting resin include epoxy resin, phenol resin, polyimide resin, bismaleimide triazine (BT) resin, and denatured-polyphenylene ether resin, for example.

Core substrate 2 has first surface 21 and second surface 22. First surface 21 and second surface 22 respectively constitute a front and a back of core substrate 2.

Core substrate 2 includes a conductor layer 4 disposed at each of first surface 21 and second surface 22. Conductor layer 4 is a layer provided with a conductor pattern. A line-and-space (L/S) of each of conductor layers 4 is (line width ranging from 5 µm to 100 µm inclusive)/(space width ranging from 5 µm to 100 µm inclusive), for example. The conductor patterns can include lands. The lands are used for interlayer-couplings, for example. When the lands are round lands, each diameter of the lands ranges from 50 µm to 300 µm inclusive, for example. Specific examples of conductor layer 4 include a signal layer, a power supply layer, and a ground layer. A signal layer is a layer mainly used to transmit electric signals. A power supply layer is a layer used to supply power. A ground layer is a layer used to attain a ground potential. Conductor layer 4 disposed at first surface 21 and conductor layer 4 disposed at second surface 22 may be interlayer-coupled or may not be interlayer-coupled. A thickness of core substrate 2 excluding conductor layers 4 ranges from 15 µm to 200 µm inclusive, for example. A thickness of each of conductor layers 4 ranges from 5 µm to 35 µm inclusive, for example.

Figure 2A:
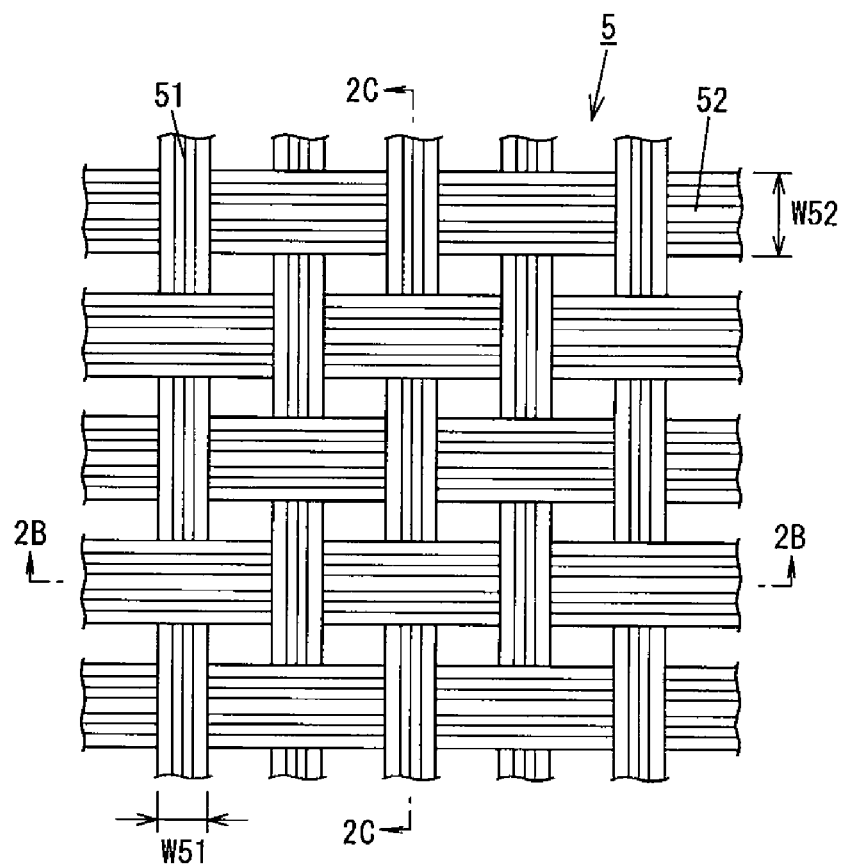
FIG. 2A is a schematic plan view illustrating glass cloth used in a core substrate of the multilayer printed wiring board according to the first exemplary embodiment.
Figure 2B:
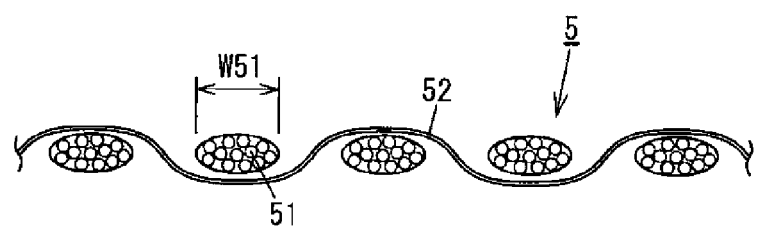
FIG. 2B is a cross-sectional view taken along line 2B-2B in FIG. 2A.
Figure 2C:
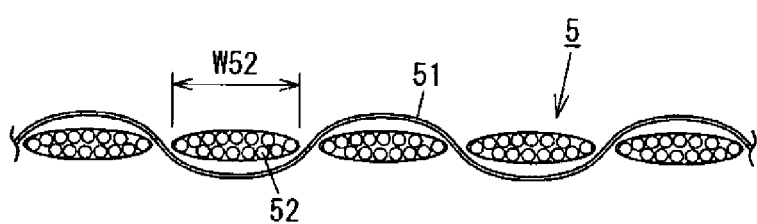
FIG. 2C is a cross-sectional view taken along line 2C-2C in FIG. 2A.

Core substrate 2 includes glass cloth 5 between first surface 21 and second surface 22. FIGS. 2A to 2C illustrate glass cloth 5. FIG. 2A is a schematic plan view of glass cloth 5. FIG. 2B is a cross-sectional view taken along line 2B-2B in FIG. 2A. FIG. 2C is a cross-sectional view taken along line 2C-2C in FIG. 2A. Glass cloth 5 in core substrate 2 is woven with warp threads 51 and weft threads 52. Warp threads 51 and weft threads 52 are glass fiber threads. As illustrated in FIG. 2A, warp threads 51 and weft threads 52 are perpendicular to each other in planer view. A term "perpendicular" normally denotes a case where threads, for example, intersect with each other at right angles. However, the present specification also denotes, unless otherwise specified, a case where threads, for example, intersect with each other at an angle within a range of 90°±10°. Glass cloth 5 may be plain-woven, twill-woven, or satin-woven, as a specific example. FIG. 2A illustrates glass cloth 5 being plain-woven. Meanwhile, glass cloth 5 may be twill-woven or satin-woven. As illustrated in FIGS. 2B and 2C, a width (W51) of each of warp threads 51 is narrower than a width (W52) of each of weft threads 52 (W51<W52) in planer view. In the first exemplary embodiment, when narrow threads and wide threads are perpendicular to each other, the narrow threads are referred to as warp threads 51, while the wide threads are referred to as weft threads 52. Thus, such a case that the width of each of warp threads 51 is wider than the width of each of weft threads 52 never happens. In this case, the term names of warp threads 51 and weft threads 52 are simply exchanged from each other. The case is substantially identical to a case that the width of each of warp threads 51 is narrower than the width of each of weft threads 52. The specific width (W51) of each of warp threads 51 falls within, but not limited to, a range from 100 μm to 600 μm inclusive. The specific width (W52) of each of weft threads 52 falls within, but not limited to, a range from 100 μm to 600 μm inclusive. A fabric density of warp threads 51 falls within, but not limited to, a range from 20 pieces/25 mm to 100 pieces/25 mm inclusive. A fabric density of weft threads 52 falls within, but not limited to, a range from 20 pieces/25 mm to 100 pieces/25 mm inclusive.

Next, first buildup layer 31 will be described. As illustrated in FIG. 1, first buildup layer 31 is disposed on first surface 21 of core substrate 2. First buildup layer 31 is formed by alternately laminating at least one first insulating layer 61 and at least one first conductor layer 71. In multilayer printed wiring board 1 illustrated in FIG. 1, first buildup layer 31 is formed by laminating, from first surface 21 of core substrate 2 in order, one first insulating layer 61 and one first conductor layer 71.

Figure 6:
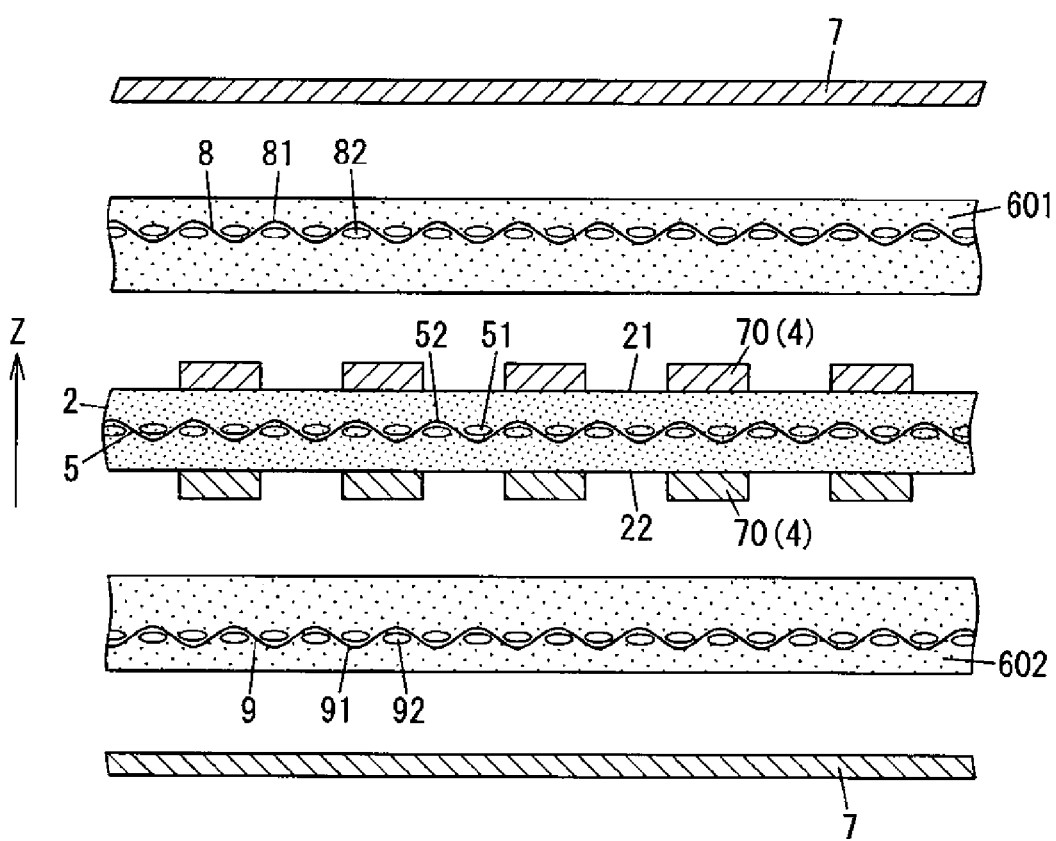
FIG. 6 is a schematic cross-sectional view for explaining a process in a method for producing a multilayer printed wiring board, according to a third exemplary embodiment.

First insulating layer 61 has electric insulation. A specific example of first insulating layer 61 is a cured product of prepreg 601. FIG. 6 illustrates prepreg 601 before curing. To acquire prepreg 601, glass cloth 8 is impregnated with a thermosetting resin. The thermosetting resin is then heated so as to be semi-cured. The thermosetting resin constituting prepreg 601 as described above is in a semi-cured state (stage B state). The semi-cured state denotes that a thermosetting resin is in a state at an intermediate stage of a curing reaction, i.e., a state between a varnish state (stage A state) and a cured state (stage C state). When prepreg 601 is further heated, the thermosetting resin once melts. The thermosetting resin is then fully cured. As a result, a cured product of prepreg 601 is acquired. The cured product can serve as first insulating layer 61. Specific examples of the thermosetting resin include epoxy resin, phenol resin, polyimide resin, bismaleimide triazine (BT) resin, and denatured-polyphenylene ether resin, for example. A thermosetting resin constituting first insulating layer 61 may be identical to or may differ from a thermosetting resin constituting core substrate 2. A thickness of first insulating layer 61 ranges from 15 μm to 200 μm inclusive, for example.

Figure 3A:
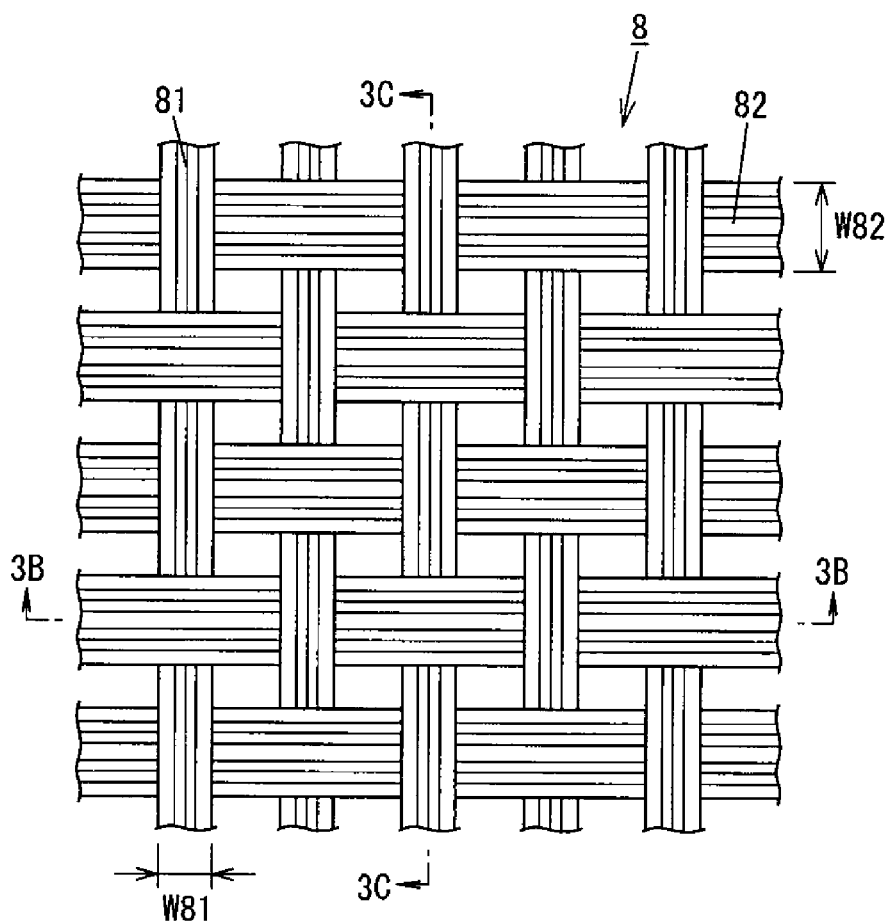
FIG. 3A is a schematic plan view illustrating glass cloth used in a first insulating layer of the multilayer printed wiring board according to the first exemplary embodiment.
Figure 3B:
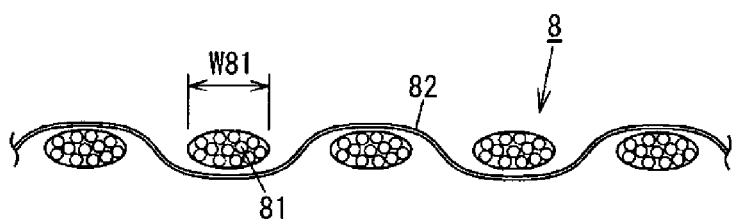
FIG. 3B is a cross-sectional view taken along line 3B-3B in FIG. 3A.
Figure 3C:
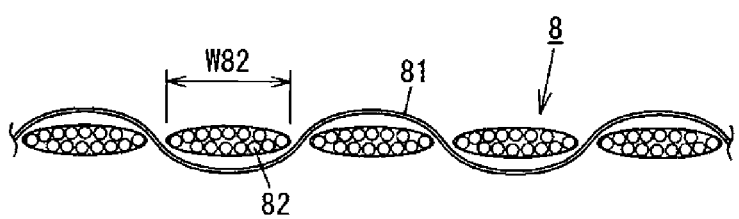
FIG. 3C is a cross-sectional view taken along line 3C-3C in FIG. 3A.

First insulating layer 61 includes glass cloth 8. FIG. 3A is a schematic plan view of glass cloth 8. FIG. 3B is a cross-sectional view taken along line 3B-3B in FIG. 3A. FIG. 3C is a cross-sectional view taken along line 3C-3C in FIG. 3A. Glass cloth 8 in first insulating layer 61 is formed substantially identical to glass cloth 5 in core substrate 2. That is, as illustrated in FIGS. 3A to 3C, glass cloth 8 in first insulating layer 61 is woven with warp threads 81 and weft threads 82. Warp threads 81 and weft threads 82 are glass fiber threads. Warp threads 81 and weft threads 82 are perpendicular to each other in planer view. Glass cloth 8 may be plain-woven, twill-woven, or satin-woven, as a specific example. Glass cloth 8 may be woven identically to or differently from glass cloth 5. A width (W81) of each of warp threads 81 is narrower than a width (W82) of each of weft threads 82 (W81<W82) in planer view. Even in this case, when narrow threads and wide threads are perpendicular to each other, the narrow threads are referred to as warp threads 81, while the wide threads are referred to as weft threads 82. The specific width (W81) of each of warp threads 81 falls within, but not limited to, a range from 100 μm to 600 μm inclusive. The specific width (W82) of each of weft threads 82 falls within, but not limited to, a range from 100 μm to 600 μm inclusive. The width (W81) of each of warp threads 81 may be identical to or may differ from the width (W51) of each of warp threads 51. The width (W82) of each of weft threads 82 may be identical to or may differ from the width (W52) of each of weft threads 52. A fabric density of warp threads 81 falls within, but not limited to, a range from 20 pieces/25 mm to 100 pieces/25 mm inclusive. A fabric density of weft threads 82 falls within, but not limited to, a range from 20 pieces/25 mm to 100 pieces/25 mm inclusive. The fabric density of warp threads 81 may be identical to or may differ from the fabric density of warp threads 51. The fabric density of weft threads 82 may be identical to or may differ from the fabric density of weft threads 52.

First conductor layer 71 is a layer provided with a conductor pattern. A line-and-space (L/S) of first conductor layer 71 is (line width ranging from 5 μm to 100 μm inclusive)/(space width ranging from 5 μm to 100 μm inclusive), for example. The conductor pattern can include lands. The lands are used for interlayer-couplings, for example. When the lands are round lands, each diameter of the lands ranges from 50 μm to 300 μm inclusive, for example. Specific examples of first conductor layer 71 include a signal layer, a power supply layer, and a ground layer. A thickness of first conductor layer 71 ranges from 5 μm to 35 μm inclusive, for example.

Figure 7:
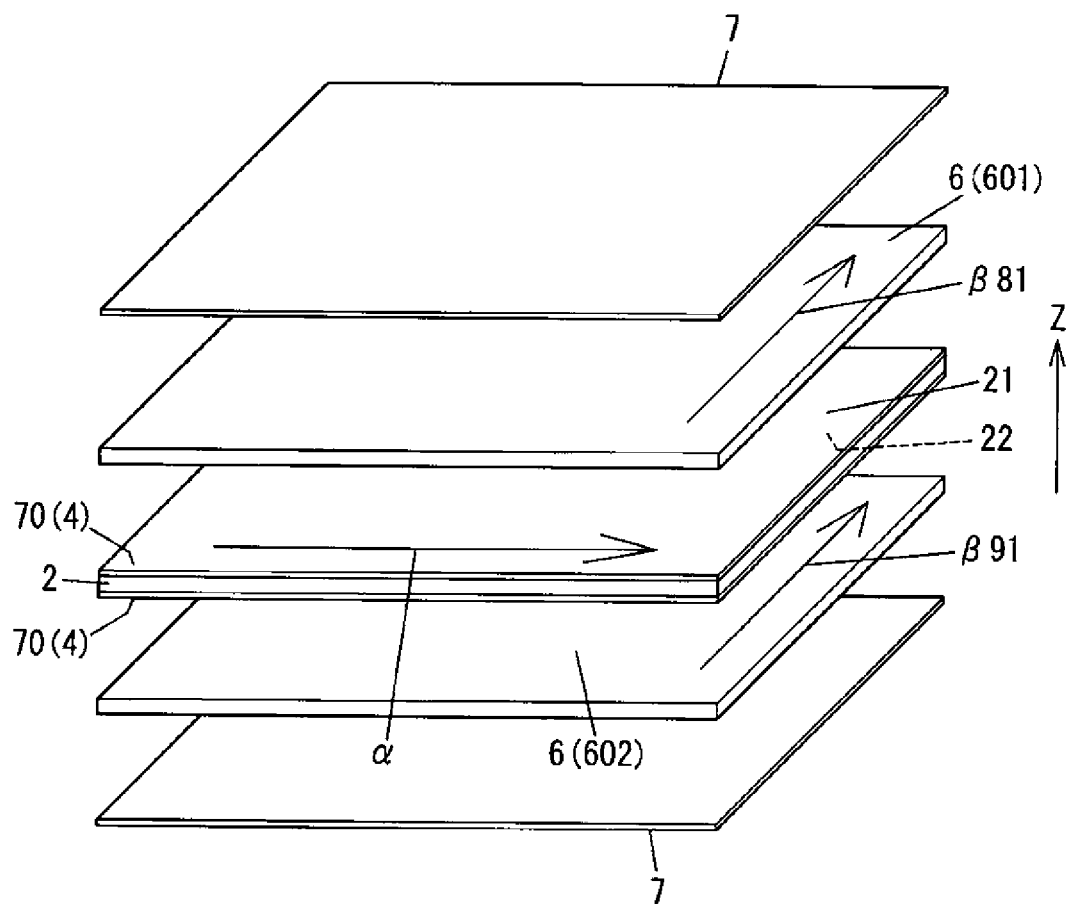
FIG. 7 is a schematic perspective view for explaining a process in the method for producing a multilayer printed wiring board, according to the third exemplary embodiment.

As illustrated in FIG. 7 described later, a direction (arrow β81) of each of warp threads 81 constituting glass cloth 8 in first insulating layer 61 (FIG. 7 illustrates prepreg 601 before curing) lying adjacent to first surface 21 of core substrate 2 is perpendicular to a direction (arrow α) of each of warp threads 51 constituting glass cloth 5 in core substrate 2, in planer view. This can also be expressed as described below. That is, in glass cloth 5, warp threads 51 and weft threads 52 are perpendicular to each other in planer view. In glass cloth 8, warp threads 81 and weft threads 82 are perpendicular to each other in planer view. In other words, each of weft threads 82 constituting glass cloth 8 in first insulating layer 61 lying adjacent to first surface 21 of core substrate 2 is arranged perpendicular to each of weft threads 52 constituting glass cloth 5 in core substrate 2, in planer view. FIG. 7 illustrates that conductor layers 4 in core substrate 2 each have a flat surface. However, the present disclosure is not limited to this example.

Next, second buildup layer 32 will be described. As illustrated in FIG. 1, second buildup layer 32 is disposed on second surface 22 of core substrate 2. Second buildup layer 32 is formed by alternately laminating at least one second insulating layer 62 and at least one second conductor layer 72. In multilayer printed wiring board 1 illustrated in FIG. 1, second buildup layer 32 is formed by laminating, from second surface 22 of core substrate 2 in order, one second insulating layer 62 and one second conductor layer 72.

Second insulating layer 62 is formed substantially identical to first insulating layer 61. That is, second insulating layer 62 has electric insulation. A specific example of second insulating layer 62 is a cured product of prepreg 602. FIG. 6 illustrates prepreg 602 before curing. To acquire prepreg 602, glass cloth 9 is impregnated with a thermosetting resin. The thermosetting resin is then heated so as to be semi-cured. When prepreg 602 is further heated, the thermosetting resin once melts. The thermosetting resin is then fully cured. As a result, a cured product of prepreg 602 is acquired. The cured product can serve as second insulating layer 62. Specific examples of the thermosetting resin include epoxy resin, phenol resin, polyimide resin, bismaleimide triazine (BT) resin, and denatured-polyphenylene ether resin, for example. A thermosetting resin constituting second insulating layer 62 may be identical to or may differ from a thermosetting resin constituting core substrate 2. A thickness of second insulating layer 62 ranges from 15 µm to 200 µm inclusive, for example.

Figure 4A:
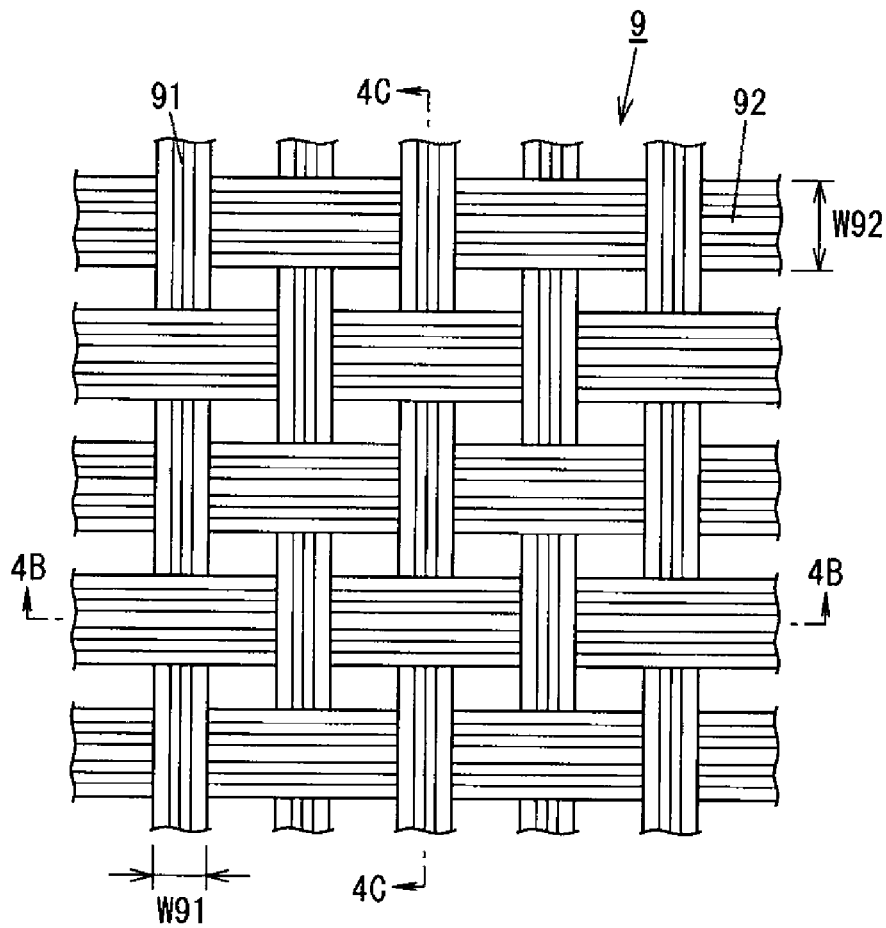
FIG. 4A is a schematic plan view illustrating glass cloth used in a second insulating layer of the multilayer printed wiring board according to the first exemplary embodiment.
Figure 4B:
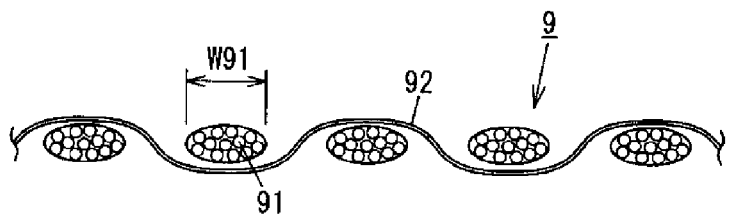
FIG. 4B is a cross-sectional view taken along line 4B-4B in FIG. 4A.
Figure 4C:
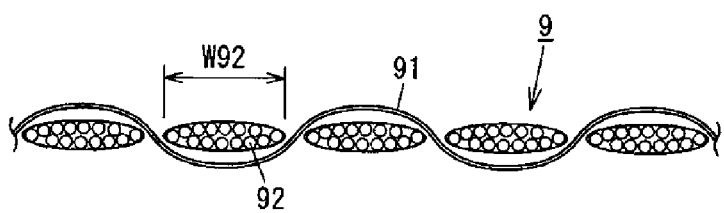
FIG. 4C is a cross-sectional view taken along line 4C-4C in FIG. 4A.

Second insulating layer 62 includes glass cloth 9. FIG. 4A is a schematic plan view of glass cloth 9. FIG. 4B is a cross-sectional view taken along line 4B-4B in FIG. 4A. FIG. 4C is a cross-sectional view taken along line 4C-4C in FIG. 4A. Glass cloth 9 in second insulating layer 62 is formed substantially identical to glass cloth 5 in core substrate 2. That is, as illustrated in FIGS. 4A to 4C, glass cloth 9 in second insulating layer 62 is woven with warp threads 91 and weft threads 92. Warp threads 91 and weft threads 92 are glass fiber threads. Warp threads 91 and weft threads 92 are perpendicular to each other in planer view. Glass cloth 9 may be plain-woven, twill-woven, or satin-woven, as a specific example. Glass cloth 9 may be woven identically to or differently from glass cloth 5. A width (W91) of each of warp threads 91 is narrower than a width (W92) of each of weft threads 92 (W91<W92), in planer view. Even in this case, when narrow threads and wide threads are perpendicular to each other, the narrow threads are referred to as warp threads 91, while the wide threads are referred to as weft threads 92. The specific width (W91) of each of warp threads 91 falls within, but not limited to, a range from 100 µm to 600 µm inclusive. The specific width (W92) of each of weft threads 92 falls within, but not limited to, a range from 100 µm to 600 µm inclusive. The width (W91) of each of warp threads 91 may be identical to or may differ from the width (W51) of each of warp threads 51. The width (W92) of each of weft threads 92 may be identical to or may differ from the width (W52) of each of weft threads 52. A fabric density of warp threads 91 falls within, but not limited to, a range from 20 pieces/25 mm to 100 pieces/25 mm inclusive. A fabric density of weft threads 92 falls within, but not limited to, a range from 20 pieces/25 mm to 100 pieces/25 mm inclusive. The fabric density of warp threads 91 may be identical to or may differ from the fabric density of warp threads 51. The fabric density of weft threads 92 may be identical to or may differ from the fabric density of weft threads 52.

Second conductor layer 72 is formed substantially identical to first conductor layer 71. Second conductor layer 72 is a layer provided with a conductor pattern. A line-and-space (L/S) of second conductor layer 72 is (line width ranging from 5 µm to 100 µm inclusive)/(space width ranging from 5 µm to 100 µm inclusive), for example. The conductor pattern can include lands. The lands are used for interlayer-couplings, for example. When the lands are round lands, each diameter of the lands ranges from 50 µm to 300 µm inclusive, for example. Specific examples of second conductor layer 72 include a signal layer, a power supply layer, and a ground layer. A thickness of second conductor layer 72 ranges from 5 µm to 35 µm inclusive, for example.

As illustrated in FIG. 7 described later, a direction (arrow β91) of each of warp threads 91 constituting glass cloth 9 in second insulating layer 62 (FIG. 7 illustrates prepreg 602 before curing) lying adjacent to second surface 22 of core substrate 2 is perpendicular to the direction (arrow α) of each of warp threads 51 constituting glass cloth 5 in core substrate 2, in planer view. This can also be expressed as described below. That is, in glass cloth 5, warp threads 51 and weft threads 52 are perpendicular to each other in planer view. In glass cloth 9, warp threads 91 and weft threads 92 are perpendicular to each other in planer view. In other words, each of weft threads 92 constituting glass cloth 9 in second insulating layer 62 lying adjacent to second surface 22 of core substrate 2 is arranged perpendicular to each of weft threads 52 constituting glass cloth 5 in core substrate 2, in planer view.

In multilayer printed wiring board 1 illustrated in FIG. 1, when conductor layers 4, first conductor layer 71, and second conductor layer 72 are all referred to as conductor layers 70, multilayer printed wiring board 1 includes four conductor layers 70, and thus is referred to as a four-layered board. When the four-layered board is used as is, lands used for mounting components are provided, as required, on first conductor layer 71 and second conductor layer 72 both serving as outer layers.

In glass cloth 5, 8, and 9 used in multilayer printed wiring board 1, the widths (W51, W81, and W91) of warp threads 51, 81, and 91 are respectively narrower than the widths (W52, W82, and W92) of weft threads 52, 82, and 92. Therefore, glass cloth 5, 8, and 9 all have anisotropy. If warp threads 51, 81, and 91 adjacent to each other in the thickness direction of multilayer printed wiring board 1 are parallel to each other in planer view, while weft threads 52, 82, and 92 adjacent to each other are parallel to each other in planer view, multilayer printed wiring board 1 wholly has anisotropy. However, in the first exemplary embodiment, warp threads 51, 81 adjacent to each other in the thickness direction of multilayer printed wiring board 1 are perpendicular to each other in planer view, while warp threads 51, 91 adjacent to each other are perpendicular to each other in planer view. Similarly, weft threads 52, 82 adjacent to each other in the thickness direction of multilayer printed wiring board 1 are perpendicular to each other in planer view, while weft threads 52, 92 adjacent to each other are perpendicular to each other in planer view. This cancels out the anisotropy. Multilayer printed wiring board 1 wholly has isotropy. Hence, multilayer printed wiring board 1 can be improved in dimensional stability and position accuracy. Specifically, when core substrate 2 is provided with first buildup layer 31 and second buildup layer 32, conductor patterns of conductor layers 4 in core substrate 2 can be inhibited from deviating in position from respective original positions. The conductor patterns of first conductor layer 71 and second conductor layer 72 can also be inhibited from deviating in position relative to the conductor patterns of conductor layers 4.

It is preferable that conditions (1) to (3) described below be all satisfied.

(1) A ratio (W52/W51) of the width (W52) of each of weft threads 52 with respect to the width (W51) of each of warp threads 51 constituting glass cloth 5 in core substrate 2 preferably ranges from 1.10 to 2.50 inclusive, and more preferably ranges from 1.54 to 2.05 inclusive.

(2) A ratio (W82/W81) of the width (W82) of each of weft threads 82 with respect to the width (W81) of each of warp threads 81 constituting glass cloth 8 in first insulating layer 61 preferably ranges from 1.10 to 2.50 inclusive, and more preferably ranges from 1.54 to 2.05 inclusive.

(3) A ratio (W92/W91) of the width (W92) of each of weft threads 92 with respect to the width (W91) of each of warp threads 91 constituting glass cloth 9 in second insulating layer 62 preferably ranges from 1.10 to 2.50 inclusive, and more preferably ranges from 1.54 to 2.05 inclusive.

When conditions (1) to (3) described above are all satisfied, core substrate 2, first insulating layer 61, and second insulating layer 62 can respectively have substantially identical anisotropy within a surface perpendicular to the thickness direction. As a result, when warp threads 51, 81 are made perpendicular to each other, as well as warp threads 51, 91 are made perpendicular to each other, isotropy can wholly and easily appear, further improving position accuracy.

Second Exemplary Embodiment

Figure 5:
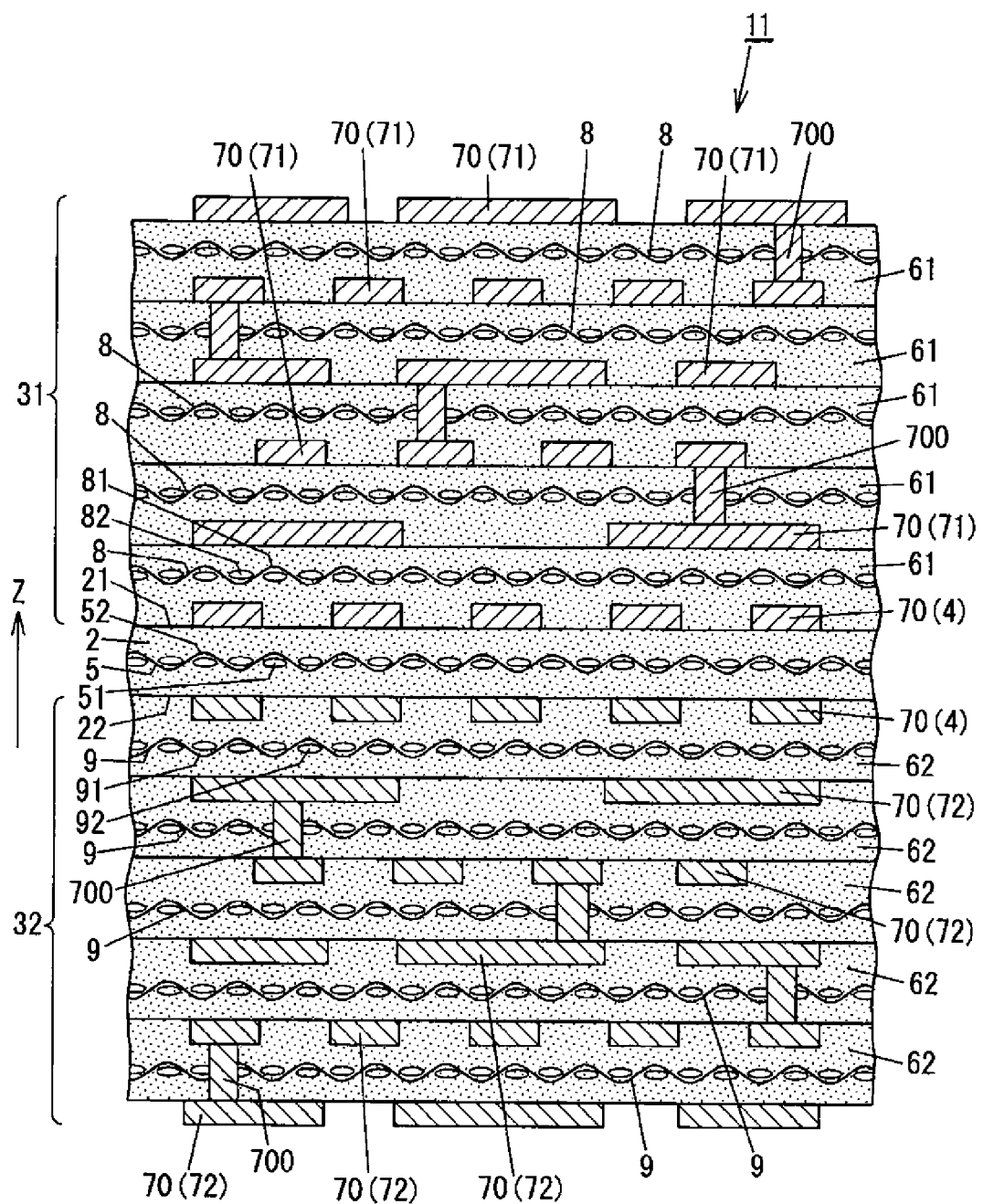
FIG. 5 is a schematic cross-sectional view illustrating a multilayer printed wiring board according to a second exemplary embodiment.

In the second exemplary embodiment, multilayer printed wiring board 11 of a 12-layered board will be described. FIG. 5 illustrates multilayer printed wiring board 11 according to the second exemplary embodiment. In FIG. 5, Z axis represents a thickness direction of multilayer printed wiring board 11. Multilayer printed wiring board 11 includes core substrate 2, first buildup layer 31, and second buildup layer 32.

Core substrate 2 is substantially identical to core substrate 2 according to the first exemplary embodiment, and will not be described.

First buildup layer 31 will be described. First buildup layer 31 is disposed on first surface 21 of core substrate 2. First buildup layer 31 is formed by alternately laminating at least one first insulating layer 61 and at least one first conductor layer 71. In multilayer printed wiring board 11 illustrated in FIG. 5, first buildup layer 31 is formed by alternately laminating, from first surface 21 of core substrate 2 in order, five first insulating layers 61 and five first conductor layers 71. When the numbers of first insulating layers 61 and first conductor layers 71 are increased, wiring density can be increased. However, the numbers are not limited to any particular numbers.

First insulating layers 61 and first conductor layers 71 respectively are each substantially identical to first insulating layer 61 and first conductor layer 71 according to the first exemplary embodiment, and will not be described accordingly.

Figure 8:
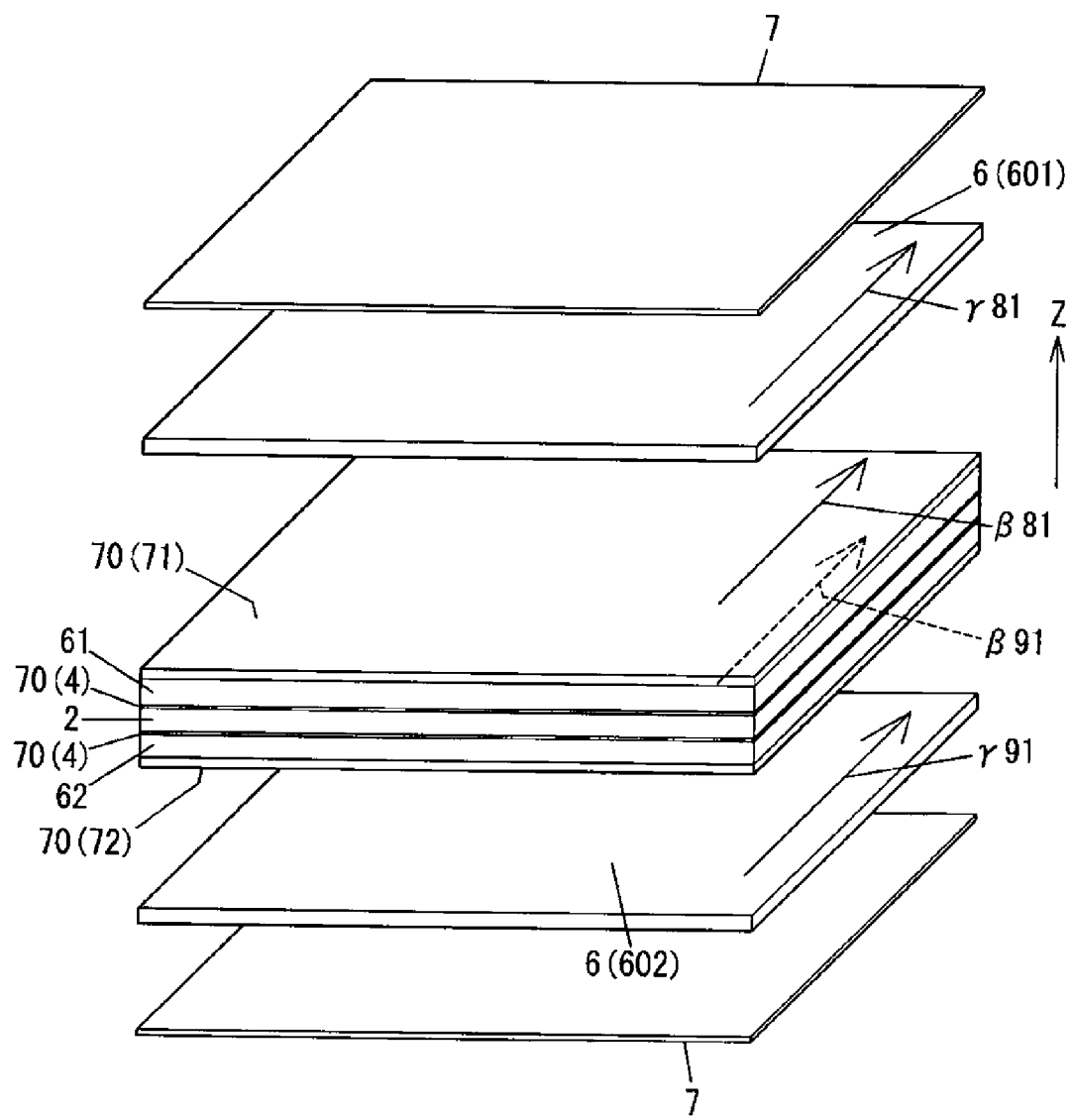
FIG. 8 is a schematic perspective view for explaining a process in a method for producing a multilayer printed wiring board, according to a fourth exemplary embodiment.
Figure 9:
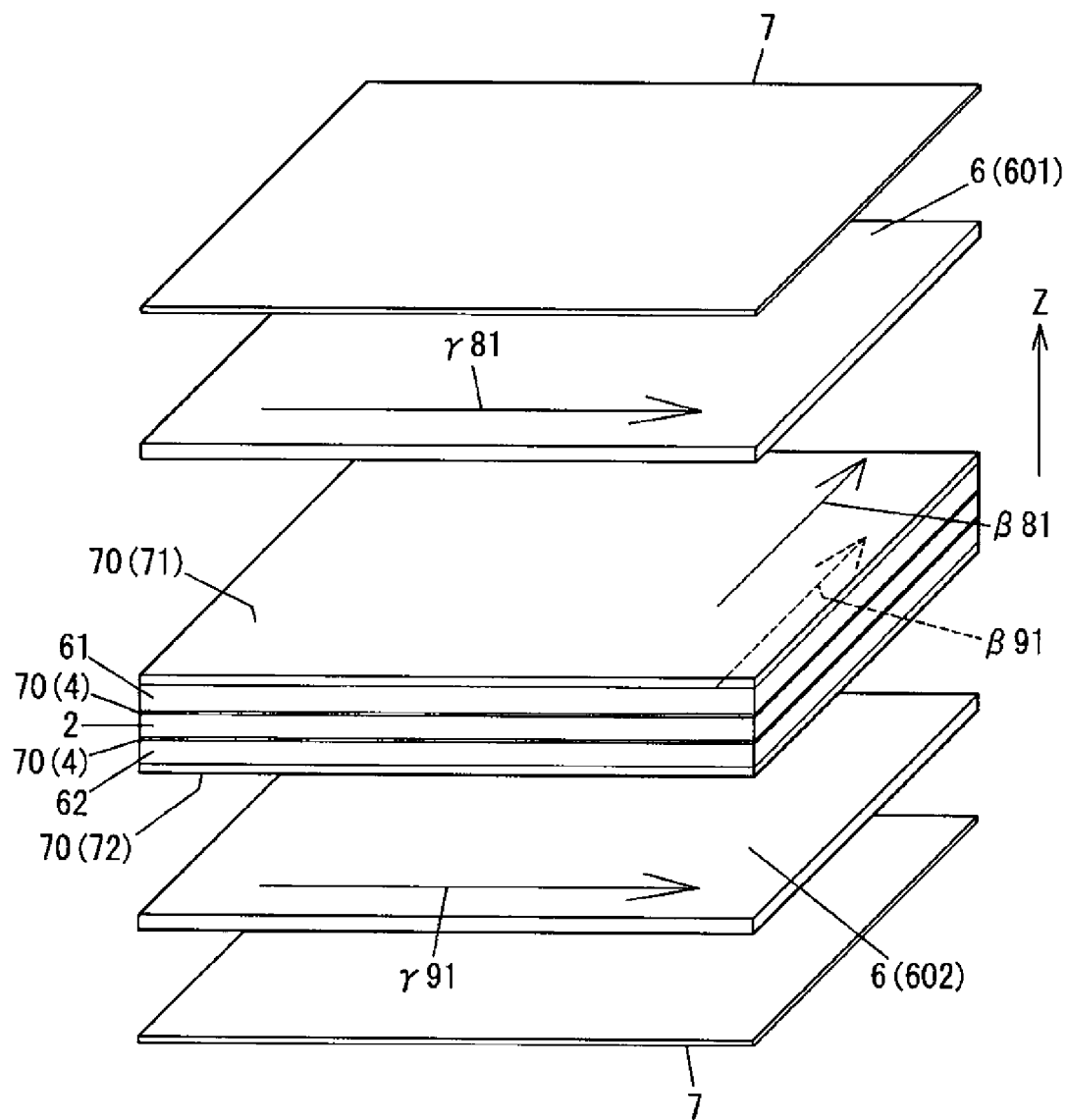
FIG. 9 is a schematic perspective view for explaining a process in a method for producing a multilayer printed wiring board, according to a modification example to the fourth exemplary embodiment.

As illustrated in FIG. 7 described later, similar to the first exemplary embodiment, a direction (arrow β81) of each of warp threads 81 constituting glass cloth 8 in first insulating layers 61 (FIG. 7 illustrates prepreg 601 before curing) lying adjacent to first surface 21 of core substrate 2 is perpendicular to a direction (arrow α) of each of warp threads 51 constituting glass cloth 5 in core substrate 2, in planer view. However, as illustrated in FIGS. 8 and 9 described later, an direction (arrow γ81) of each of warp threads 81 constituting glass cloth 8 in first insulating layers 61 that do not lie adjacent to first surface 21 of core substrate 2 can be freely determined. It is preferable that, as illustrated with arrow β81 and arrow γ81 in FIG. 9 described later, warp threads 81, 81 adjacent to each other in the thickness direction of first buildup layer 31 are perpendicular to each other in planer view. At this time, weft threads 82, 82 are also perpendicular to each other in planer view. This can further improve multilayer printed wiring board 11 in dimensional stability and position accuracy. FIGS. 8 and 9 illustrate that first conductor layers 71 and second conductor layers 72 each have a flat surface. However, the present disclosure is not limited to this example.

Next, second buildup layer 32 will be described. Second buildup layer 32 is disposed on second surface 22 of core substrate 2. Second buildup layer 32 is formed by alternately laminating at least one second insulating layer 62 and at least one second conductor layer 72. In multilayer printed wiring board 11 illustrated in FIG. 5, second buildup layer 32 is formed by alternately laminating, from second surface 22 of core substrate 2 in order, five second insulating layers 62 and five second conductor layers 72. When the numbers of second insulating layers 62 and second conductor layers 72 are increased, wiring density can be increased. However, the numbers are not limited to any particular numbers. The numbers of second insulating layers 62 and second conductor layers 72 constituting second buildup layer 32 respectively may be identical to or may differ from the numbers of first insulating layers 61 and first conductor layers 71 constituting first buildup layer 31.

Second insulating layers 62 and second conductor layers 72 respectively are each substantially identical to second insulating layer 62 and second conductor layer 72 according to the first exemplary embodiment, and will not be described accordingly.

As illustrated in FIG. 7 described later, similar to the first exemplary embodiment, a direction (arrow β91) of each of warp threads 91 constituting glass cloth 9 in second insulating layers 62 (FIG. 7 illustrates prepreg 602 before curing) lying adjacent to second surface 22 of core substrate 2 is perpendicular to the direction (arrow α) of each of warp threads 51 constituting glass cloth 5 in core substrate 2, in planer view. However, as illustrated in FIGS. 8 and 9 described later, an direction (arrow γ91) of each of warp threads 91 constituting glass cloth 9 in second insulating layers 62 that do not lie adjacent to second surface 22 of core substrate 2 can be freely determined. It is preferable that, as illustrated with arrow β91 and arrow γ91 in FIG. 9 described later, warp threads 91, 91 adjacent to each other in the thickness direction of second buildup layer 32 are perpendicular to each other in planer view. At this time, weft threads 92, 92 are also perpendicular to each other in planer view. This can further improve multilayer printed wiring board 11 in dimensional stability and position accuracy.

In multilayer printed wiring board 11 illustrated in FIG. 5, first conductor layers 71, 71 adjacent to each other in the thickness direction are respectively interlayer-coupled through via holes 700. Second conductor layers 72, 72 adjacent to each other in the thickness direction are respectively interlayer-coupled through via holes 700. Via holes 700 include penetrated via holes and non-penetrated via holes (interstitial via holes). The non-penetrated via holes include blind via holes and buried via holes. A via diameter of each of via holes 700 ranges from 25 μm to 250 μm inclusive, for example.

In multilayer printed wiring board 11 illustrated in FIG. 5, when conductor layers 4, first conductor layers 71, and second conductor layers 72 are all referred to as conductor layers 70, multilayer printed wiring board 11 includes twelve conductor layers 70, and is referred to as a twelve-layered board. When the twelve-layered board is used as is, lands used for mounting components are provided, as required, on first conductor layers 71 and second conductor layer 72 both serving as outer layers.

Even in the second exemplary embodiment, warp threads 51, 81 adjacent to each other in the thickness direction of multilayer printed wiring board 11 are perpendicular to each other in planer view, while warp threads 51, 91 adjacent to each other are perpendicular to each other in planer view. Similarly, weft threads 52, 82 adjacent to each other in the thickness direction of multilayer printed wiring board 11 are perpendicular to each other in planer view, while weft threads 52, 92 adjacent to each other are perpendicular to each other in planer view. This cancels out the anisotropy. Multilayer printed wiring board 11 wholly has isotropy. Therefore, multilayer printed wiring board 11 can be improved in dimensional stability and position accuracy. Specifically, when core substrate 2 is provided with first buildup layer 31 and second buildup layer 32, conductor patterns of conductor layers 4 in core substrate 2 can be suppressed from deviating in position from respective original positions. The conductor patterns of first conductor layers 71 and second conductor layers 72 can also be inhibited from deviating in position relative to the conductor patterns of conductor layers 4. Further, compared with a case where layers are stacked as illustrated in FIG. 8, when layers are stacked as illustrated in FIG. 9, first conductor layers 71, 71 and second conductor layers 72, 72 respectively adjacent to each other in the thickness direction of multilayer printed wiring board 11 can further be inhibited from deviating in position. Therefore, disconnection in via holes 700 can also be inhibited, achieving multilayer printed wiring board 11 with higher coupling reliability.

In multilayer printed wiring board 11 illustrated in FIG. 5, the numbers of first insulating layers 61 and first conductor layers 71 in first buildup layer 31 and the numbers of second insulating layers 62 and second conductor layers 72 in second buildup layer 32 are identical to each other. Therefore, multilayer printed wiring board 11 is symmetric in the thickness direction with respect to core substrate 2. As described above, the numbers of first insulating layers 61 and first conductor layers 71 in first buildup layer 31 and the numbers of second insulating layers 62 and second conductor layers 72 in second buildup layer 32 may differ from each other. In this case, multilayer printed wiring board 11 is asymmetric in the thickness direction.

Third Exemplary Embodiment

In the third exemplary embodiment, a method for producing multilayer printed wiring board 1 (four-layered board) according to the first exemplary embodiment will be described. That is, the method for producing multilayer printed wiring board 1, according to the third exemplary embodiment, includes processes A to C described below.

First, in process A, as illustrated in FIG. 6, core substrate 2, prepreg 601, 602, and metal foil 7 are prepared.

Core substrate 2 is identical to core substrate 2 according to the first exemplary embodiment. That is, core substrate 2 includes first surface 21 and second surface 22. Core substrate 2 includes a conductor layer 4 disposed at each of first surface 21 and second surface 22. Core substrate 2 includes glass cloth 5 as illustrated in FIG. 2 between first surface 21 and second surface 22. Glass cloth 5 is woven with warp threads 51 and weft threads 52. The width (W51) of each of warp threads 51 is narrower than the width (W52) of each of weft threads 52 (W51<W52). As illustrated in FIG. 7, it is preferable that a shape of core substrate 2 in planer view be a rectangular shape having long sides and short sides. It is more preferable that, warp threads 51 constituting glass cloth 5 in core substrate 2 be parallel to the long sides, while weft threads 52 be parallel to the short sides, or otherwise warp threads 51 be parallel to the short sides, while weft threads 52 be parallel to the long sides. Here is described a case where warp threads 51 constituting glass cloth 5 in core substrate 2 having the rectangular shape are parallel to the long sides, while weft threads 52 are parallel to the short sides. In FIG. 7, arrow α indicates the direction of each of warp threads 51 constituting glass cloth 5 in core substrate 2.

Prepreg 601 is identical to prepreg 601 according to the first exemplary embodiment. That is, prepreg 601 is used to form first insulating layer 61 in first buildup layer 31. Prepreg 601 includes glass cloth 8 as illustrated in FIG. 3. Glass cloth 8 is woven with warp threads 81 and weft threads 82. The width (W81) of each of warp threads 81 is narrower than the width (W82) of each of weft threads 82 (W81<W82). As illustrated in FIG. 7, it is preferable that a shape of prepreg 601 in planer view be a rectangular shape having long sides and short sides, as well as be identical in size to core substrate 2. It is more preferable that warp threads 81 constituting glass cloth 8 in prepreg 601 be parallel to the short sides, while weft threads 82 be parallel to the long sides, or otherwise warp threads 81 be parallel to the long sides, while weft threads 82 be parallel to the short sides. Here is described a case where warp threads 81 constituting glass cloth 8 in prepreg 601 having the rectangular shape are parallel to the short sides, while weft threads 82 are parallel to the long sides. In FIG. 7, arrow β81 indicates the direction of each of warp threads 81 constituting glass cloth 8 in prepreg 601.

Prepreg 602 is identical to prepreg 602 according to the first exemplary embodiment. That is, prepreg 602 is used to form second insulating layer 62 in second buildup layer 32. Prepreg 602 includes glass cloth 9 as illustrated in FIG. 4. Glass cloth 9 is woven with warp threads 91 and weft threads 92. The width (W91) of each of warp threads 91 is narrower than the width (W92) of each of weft threads 92 (W91<W92). As illustrated in FIG. 7, it is preferable that a shape of prepreg 602 in planer view be a rectangular shape having long sides and short sides, as well as be identical in size to core substrate 2. It is more preferable that warp threads 91 constituting glass cloth 9 in prepreg 602 be parallel to the short sides, while weft threads 92 be parallel to the long sides, or otherwise warp threads 91 be parallel to the long sides, while weft threads 92 be parallel to the short sides. Here is described a case where warp threads 91 constituting glass cloth 9 in prepreg 602 having the rectangular shape are parallel to the short sides, while weft threads 92 are parallel to the long sides. In FIG. 7, arrow β91 indicates the direction of each of warp threads 91 constituting glass cloth 9 in prepreg 602.

Prepreg 601, 602 may be structurally identical to or may structurally differ from each other. Pieces of prepreg structurally identical to each other can be advantageous for multilayer printed wiring board 1 in terms of production cost.

Metal foil 7 is used to form first conductor layer 71 in first buildup layer 31 and second conductor layer 72 in second buildup layer 32.

Next, in process B and onward, the buildup method is used. That is, in process B, as illustrated in FIGS. 6 and 7, prepreg 601 and prepreg 602 are respectively stacked on first surface 21 and second surface 22 of core substrate 2. In this case, prepreg 601 is stacked on first surface 21 of core substrate 2 to allow the direction (arrow α) of each of warp threads 51 constituting glass cloth 5 in core substrate 2 to be perpendicular to the direction (arrow β81) of each of warp threads 81 in prepreg 601, in planer view. At this time, when core substrate 2 and prepreg 601 respectively have rectangular shapes identical in size to each other, by simply aligning long sides each other and short sides each other, the direction (arrow α) of each of warp threads 51 and the direction (arrow β81) of each of warp threads 81 can be easily made perpendicular to each other. On the other hand, prepreg 602 is stacked on second surface 22 of core substrate 2 to allow the direction (arrow α) of each of warp threads 51 constituting glass cloth 5 in core substrate 2 to be perpendicular to the direction (arrow β91) of each of warp threads 91 in prepreg 602, in planer view. At this time, when core substrate 2 and prepreg 602 respectively have rectangular shapes identical in size to each other, by simply aligning long sides each other and short sides each other, the direction (arrow α) of each of warp threads 51 and the direction (arrow β91) of each of warp threads 91 can be easily made perpendicular to each other. After that, prepreg 601 and prepreg 602 each further overlapped with metal foil 7 are heated and pressed with a hot press, for example, for formation. A vacuum-type hot press may be used for heating and pressing. At this time, a temperature ranges from 170° C. to 220° C. inclusive, for example, and pressure ranges from 10 MPa to 50 MPa inclusive, for example.

Through heating and pressing as described above, prepreg 601 and prepreg 602 are respectively fully cured, achieving first insulating layer 61 and second insulating layer 62.

Next, in process C, metal foil 7 lying at an outermost side is processed to form conductor layers 70. To process metal foil 7, a subtractive method or a modified semi-additive process (MSAP) can be used, for example. Conductor layer 70 lying adjacent to first insulating layer 61 serves as first conductor layer 71. Conductor layer 70 lying adjacent to second insulating layer 62 serves as second conductor layer 72. Multilayer printed wiring board 1 as illustrated in FIG. 1 can thus be produced.

Fourth Exemplary Embodiment

In the fourth exemplary embodiment, a method for producing multilayer printed wiring board 11 including five or more conductor layers 70 will be described. That is, the method for producing multilayer printed wiring board 11, according to the fourth exemplary embodiment, includes, in addition to processes A to C, processes D to F to be respectively performed at least once. That is, in the fourth exemplary embodiment, a four-layered board can be used as a start material.

In process D, prepreg 601, 602 and the metal foil 7 are prepared. Herein, two kinds of prepreg 601 and prepreg 602 are prepared to increase the numbers of layers in both first buildup layer 31 and second buildup layer 32. One of the two kinds of prepreg 601 and prepreg 602 may be used to increase the numbers of layers in both first buildup layer 31 and second buildup layer 32. To increase the number of layers in either first buildup layer 31 or second buildup layer 32, either prepreg 601 or prepreg 602 may be prepared.

Prepreg 601 is identical to prepreg 601 according to the third exemplary embodiment. That is, prepreg 601 is used to form first insulating layers 61 in first buildup layer 31. Prepreg 601 includes glass cloth 8 as illustrated in FIG. 3. Glass cloth 8 is woven with warp threads 81 and weft threads 82. The width (W81) of each of warp threads 81 is narrower than the width (W82) of each of weft threads 82 (W81<W82). Here is described a case where, as illustrated in FIG. 8, warp threads 81 constituting glass cloth 8 in prepreg 601 having a rectangular shape are parallel to short sides, while weft threads 82 are parallel to long sides. In FIG. 8, arrow γ81 indicates the direction of each of warp threads 81 constituting glass cloth 8 in prepreg 601. Prepreg 601 according to the fourth exemplary embodiment is identical in shape and dimension to prepreg 601 according to the third exemplary embodiment.

Prepreg 602 is identical to prepreg 602 according to the third exemplary embodiment. That is, prepreg 602 is used to form second insulating layers 62 in second buildup layer 32. Prepreg 602 includes glass cloth 9 as illustrated in FIG. 4. Glass cloth 9 is woven with warp threads 91 and weft threads 92. The width (W91) of each of warp threads 91 is narrower than the width (W92) of each of weft threads 92 (W91<W92). Here is described a case where, as illustrated in FIG. 8, warp threads 91 constituting glass cloth 9 in prepreg 602 having a rectangular shape are parallel to short sides, while weft threads 92 are parallel to long sides. In FIG. 8, arrow γ91 indicates the direction of each of warp threads 91 constituting glass cloth 9 in prepreg 602. Prepreg 602 according to the fourth exemplary embodiment is identical in shape and dimension to prepreg 602 according to the third exemplary embodiment.

Prepreg 601, 602 may be structurally identical to or may structurally differ from each other. Pieces of prepreg structurally identical to each other can be advantageous for multilayer printed wiring board 11 in terms of production cost.

Metal foil 7 is used to form first conductor layers 71 in first buildup layer 31 and second conductor layers 72 in second buildup layer 32.

Next, in process E and onward, the buildup method is used. That is, in process E, as illustrated in FIG. 8, prepreg 6 is allowed to overlap with at least one of conductor layers 70 each lying at an outermost side. In the fourth exemplary embodiment, prepreg 601 and prepreg 602 are respectively stacked on first conductor layers 71 and second conductor layer 72 each lying at an outermost side. Meanwhile, prepreg 601 or prepreg 602 may be stacked on only either first conductor layers 71 each lying at the outermost side or second conductor layers 72 each lying at the outermost side.

In the fourth exemplary embodiment, prepreg 601 and prepreg 602 respectively identical to prepreg 601 and prepreg 602 according to the third exemplary embodiment are used. Therefore, as illustrated in FIG. 8, the direction (arrow β81) of each of warp threads 81 constituting glass cloth 8 in first insulating layer 61 formed already and the direction (arrow γ81) of each of warp threads 81 in prepreg 601 are made parallel to each other in planer view. Similarly, the direction (arrow β91) of each of warp threads 91 constituting glass cloth 9 in second insulating layer 62 formed already and the direction (arrow γ91) of each of warp threads 91 in prepreg 602 are made parallel to each other in planer view.

It is preferable that two kinds of prepreg 601 and two kinds of prepreg 602 respectively having rectangular shapes identical in dimension to each other be prepared. In one of the two kinds of prepreg 601, warp threads 81 constituting glass cloth 8 are parallel to short sides, while weft threads 82 are parallel to long sides. In the other of the two kinds of prepreg 601, warp threads 81 constituting glass cloth 8 are parallel to long sides, while weft threads 82 are parallel to short sides. However, the two kinds of prepreg 601 might not be distinguished visually from each other. Therefore, it is preferable that markings be applied so that the directions of warp threads 81 can be visually seen. Similarly, in one of the two kinds of prepreg 602, warp threads 91 constituting glass cloth 9 are parallel to the short sides, while weft threads 92 are parallel to the long sides. In the other of the two kinds of prepreg 602, warp threads 91 constituting glass cloth 9 are parallel to the long sides, while weft threads 92 are parallel to the short sides. However, in this case, the two kinds of prepreg 602 might also not be distinguished visually from each other. Therefore, it is preferable that markings also be applied so that the directions of warp threads 91 can be visually seen. By preparing and using prepreg 601, 602 as described above, warp threads 81, 81 adjacent to each other in the thickness direction of first buildup layer 31 can be made perpendicular to each other in planer view (see arrows β81, γ81), as illustrated in FIG. 9. Similarly, warp threads 91, 91 adjacent to each other in the thickness direction of second buildup layer 32 can be made perpendicular to each other in planer view (see arrows β91, γ91). This can further improve multilayer printed wiring board 11 in dimensional stability and position accuracy.

After that, prepreg 601 and prepreg 602 each further overlapped with metal foil 7 are heated and pressed with a hot press, for example, for formation. A vacuum-type hot press may be used for heating and pressing. At this time, a temperature ranges from 180° C. to 220° C. inclusive, for example, and pressure ranges from 10 MPa to 50 MPa inclusive, for example.

Through heating and pressing as described above, prepreg 601 and prepreg 602 are respectively fully cured, achieving first insulating layer 61 and second insulating layer 62.

Next, in process F, metal foil 7 lying at an outermost side is processed to form conductor layers 70. To process metal foil 7, a subtractive method or a modified semi-additive process (MSAP) can be used, for example. Conductor layers 70 respectively lying adjacent to first insulating layers 61 serve as first conductor layers 71. Conductor layers 70 respectively lying adjacent to second insulating layers 62 serve as second conductor layers 72. Multilayer printed wiring board 11 of which the number of conductor layers 70 is greater than that in a four-layered board can thus be produced. By further repeating as required a series of processes D to F, conductor layers 70 can be increased in number. Multilayer printed wiring board 11 (twelve-layered board), as illustrated in FIG. 5, for example, can also be produced.

Examples

Hereinafter, the present disclosure will be specifically described with reference to examples. However, the present disclosure is not limited to the examples described below.

Multilayer printed wiring boards (four-layered boards) were produced as samples as described below.

First, core substrates, pieces of prepreg, and pieces of metal foil were prepared.

Figure 10:
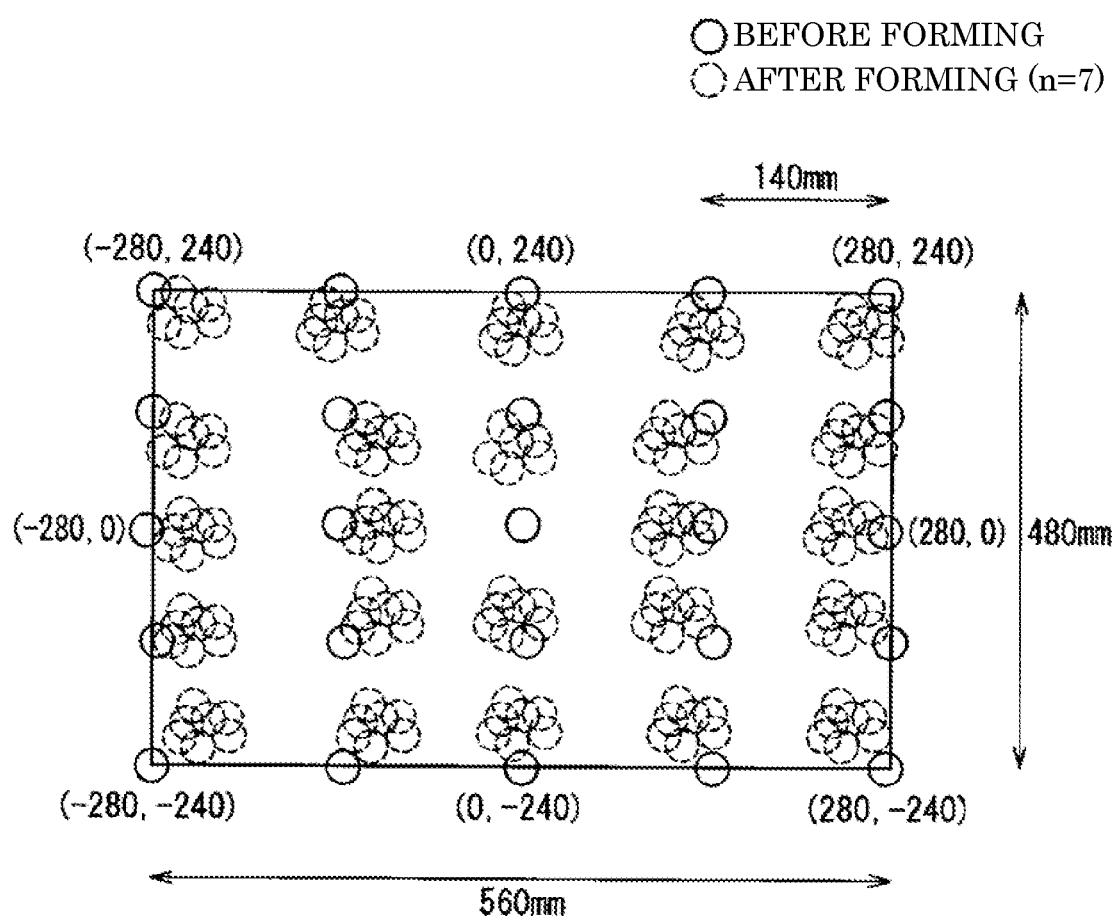
FIG. 10 is a schematic plan diagram illustrating an example when measurement points deviate in position on a sample before and after forming.

Four kinds of core substrates were prepared, as illustrated in Table 1. A sheet clad-laminated with copper on both sides was processed to acquire the core substrates. The core substrates each included one-ply glass cloth. Warp threads and weft threads constituting each glass cloth were perpendicular to each other in planer view. Tables 1 and 2 illustrate details of the glass cloth. Other insulating materials such as resin than the glass cloth in the four kinds of core substrate were identical to "R-A555(W)" produced by Panasonic Corporation. As illustrated in FIG. 10, within each region having a size of 480 mm in vertical direction×560 mm in horizontal direction on both surfaces (a first surface and a second surface) of each of the core substrates, a total of twenty five, i.e. five in the vertical direction and five in the horizontal direction, of conductor patterns (before forming) each having a circular shape with an outer diameter of 100 µm were arranged and formed at equal intervals. The positions were designated as measurement points and were measured with a "standard CNC image measuring device Quick Vision QV Apex" produced by Mitutoyo Corporation. The positions served as references for position accuracy.

The pieces of prepreg in one kind were prepared. Specifically, glass cloth constituting the pieces of prepreg was glass cloth (Style: #1037, Part number: 1037/1275/AS890MSX) produced by Asahi Kasei Corp. Other insulating materials such as resin than the glass cloth were identical to "R-A550(W)" produced by Panasonic Corporation. The pieces of prepreg included one-ply glass cloth, and had a resin content of 72% by mass. Warp threads and weft threads constituting the glass cloth were perpendicular to each other in planer view. Table 2 illustrates styles of the glass cloth.

As the pieces of metal foil, copper foil having a thickness of 12 µm was prepared.

Next, the pieces of prepreg were allowed to overlap with both the surfaces of each of the core substrate. At this time, in Examples 1 to 4, the pieces of prepreg were stacked on both the surfaces of each of the core substrates to allow each of the warp threads constituting the glass cloth in each of the core substrates to be arranged perpendicular to each of the warp threads constituting the glass cloth in each of the pieces of prepreg, in planer view. On the other hand, in Comparative Examples 1 to 4, pieces of prepreg were stacked on both surfaces of each of core substrates to allow each of warp threads constituting glass cloth in each of the core substrates to be arranged parallel to each of warp threads constituting glass cloth in each of the pieces of prepreg, in planer view.

After that, the pieces of prepreg respectively further overlapped with the pieces of metal foil were heated and pressed. At this time, a temperature ranged from 180° C. to 220° C. inclusive, pressure ranged from 10 MPa to 50 MPa inclusive, and a degree of vacuum ranged from 0 kPa to 50 kPa inclusive.

Through heating and pressing as described above, the pieces of prepreg were fully cured. As a result, a first insulating layer and a second insulating layer were formed.

Next, the pieces of metal foil each lying at outermost sides were removed through overall etching to acquire the samples. Similarly, in each of Examples 1 to 4 and Comparative Examples 1 to 4, respectively, the seven samples were acquired (n=7). However, the reason why the number of samples in each of Comparative Examples 1, 3 was six (n=6), while the number of samples in Comparative Example 4 was five (n=5), is that inappropriate measurement points were observed.

After the samples were formed, positions of measurement points were measured with a "standard CNC image measuring device Quick Vision QV Apex" produced by Mitutoyo Corporation. FIG. 10 illustrates an example of how the measurement points deviated in position. That is, for the seven samples (n=7), how the conductor patterns formed on either of the surfaces of the core substrates deviated from a position before forming to a position after forming is illustrated in an overlapped manner.

For each of Examples 1 to 4 and Comparative Examples 1 to 4, an average value and standard deviation of position deviation were calculated based on calculations at 50 locations (both surfaces) per sample×the number of samples (n=5 to 7). A standard value for the position deviation was specified to 60 µm. A process capability index (Cpk) was then acquired. Specifically, Cpk=(standard value−average value)/(3×standard deviation). Cpk represents an index used to evaluate capability of producing products (four-layered boards in this case) that fall within a specified standard limit on position deviation. Table 1 illustrates the results.

TABLE 1

| Core substrate | Thickness of core substrate (µm) | 80 | 50 | 50 | 50 |
|---|---|---|---|---|---|
| | Glass cloth | Manufacturer | | Asahi Kasei Corp. | | |
| | | Style | #1078 | #1067 | #1030 | #1037 |
| | | Part number | 1078/1275/AS890MSW | 1067/1070/AS890MSW | 1030/1275/AS890VSD | 1037/1275/AS890MSX |

TABLE 1-continued

|  | Ply | 1 ply | 1 ply | 1 ply | 1 ply |
|---|---|---|---|---|---|
|  | Resin content (% by mass) | 64 | 63 | 64 | 71 |
| Prepreg | #1037 72% Warp threads are parallel to each other | Comparative Example 1 Cpk = 1.72 (n = 6) | Comparative Example 2 Cpk = 1.50 (n = 7) | Comparative Example 3 Cpk = 1.68 (n = 6) | Comparative Example 4 Cpk = 1.10 (n = 5) |
|  | #1037 72% Warp threads are perpendicular to each other | Example 1 Cpk = 3.36 (n = 7) | Example 2 Cpk = 2.22 (n = 7) | Example 3 Cpk = 2.26 (n = 7) | Example 4 Cpk = 2.69 (n = 7) |

TABLE 2

| Style | Width of warp thread (W1) | Width of weft thread (W2) | Value of ratio (W2/W1) |
|---|---|---|---|
| #1030 | 185 | 286 | 1.55 |
| #1037 | 206 | 332 | 1.61 |
| #1067 | 213 | 354 | 1.66 |
| #1078 | 305 | 471 | 1.54 |

As is apparent from Table 1, it has been confirmed that Examples 1 to 4 have been able to further inhibit the conductor patterns formed on the core substrates from deviating in position as compared with Comparative Examples 1 to 4.

The multilayer printed wiring board according to the present disclosure can be mounted on a small-sized electronic device, as well as can be used as a substrate allowing semiconductor elements to be integrally mounted in a highly dense manner.

The invention claimed is:

1. A multilayer printed wiring board comprising:
   a core substrate having a first surface and a second surface;
   a first buildup layer disposed on the first surface; and
   a second buildup layer disposed on the second surface, wherein:
   the core substrate includes a conductor layer disposed at each of the first surface and the second surface, and a first glass cloth disposed between the first surface and the second surface,
   the first glass cloth is woven with first warp threads and first weft threads, the first warp threads each having a width narrower than a width of each of the first weft threads,
   the first buildup layer includes at least one first insulating layer and at least one first conductor layer which are alternately laminated with each other,
   the at least one first insulating layer includes a second glass cloth,
   the second glass cloth is woven with second warp threads and second weft threads, the second warp threads each having a width narrower than a width of each of the second weft threads,
   the second buildup layer includes at least one second insulating layer and at least one second conductor layer which are alternately laminated with each other,
   the at least one second insulating layer includes a third glass cloth,
   the third glass cloth is woven with third warp threads and third weft threads, the third warp threads each having a width narrower than a width of each of the third weft threads,
   each of the second warp threads constituting the second glass cloth in the at least one first insulating layer lying adjacent to the first surface of the core substrate is arranged perpendicular to each of the first warp threads constituting the first glass cloth, and
   each of the third warp threads constituting the third glass cloth in the at least one second insulating layer lying adjacent to the second surface of the core substrate is arranged perpendicular to each of the first warp threads constituting the first glass cloth.

2. The multilayer printed wiring board according to claim 1, wherein:
   a ratio of the width of each of the first weft threads with respect to the width of each of the first warp threads ranges from 1.10 to 2.50, inclusive,
   a ratio of the width of each of the second weft threads with respect to the width of each of the second warp threads ranges from 1.10 to 2.50, inclusive, and
   a ratio of the width of each of the third weft threads with respect to the width of each of the third warp threads ranges from 1.10 to 2.50, inclusive.

3. A method for producing a multilayer printed wiring board, the method comprising:
   preparing a core substrate, a first prepreg, a second prepreg, a first metal foil, and a second metal foil,
      the core substrate having a first surface and a second surface, the core substrate including a conductor layer disposed at each of the first surface and the second surface, and a first glass cloth woven with first warp threads and first weft threads, the first warp threads each having a width narrower than a width of each of the first weft threads,
      the first prepreg including a second glass cloth woven with second warp threads and second weft threads, the second warp threads each having a width narrower than a width of each of the second weft threads,
      the second prepreg including a third glass cloth woven with third warp threads and third weft threads, the third warp threads each having a width narrower than a width of each of the third weft threads;
   heating and pressing the core substrate, the first prepreg, the first metal foil, the second prepreg, and the second metal foil which are stacked with each other,
      the first prepreg being stacked on the first surface of the core substrate to allow each of the first warp threads constituting the first glass cloth to be arranged perpendicular to each of the second warp threads constituting the second glass cloth,
      the first metal foil being further stacked on the first prepreg,
      the second prepreg being stacked on the second surface of the core substrate to allow each of the first warp threads constituting the first glass cloth to be arranged perpendicular to each of the third warp threads constituting the third glass cloth, the second metal foil being further stacked on the second prepreg; and processing the first metal foil to form a first conductor layer, and processing the second metal foil to form a second conductor layer.

4. The method for producing a multilayer printed wiring board according to claim 3, the method further comprising, at least once:

preparing a third prepreg and a third metal foil, the third prepreg including a fourth glass cloth woven with fourth warp threads and fourth weft threads, the fourth warp threads each having a width narrower than a width of each of the fourth weft threads;

heating and pressing the third prepreg and the third metal foil which are stacked with each other, the third prepreg being stacked on at least one of the first conductor layer and the second conductor layer, the third metal foil being further stacked on the third prepreg; and processing the third metal foil to form a third conductor layer, the third metal foil lying at a outermost surface of multilayer printed wiring board.

* * * * *